United States Patent
Fan et al.

[11] Patent Number: 6,080,627
[45] Date of Patent: Jun. 27, 2000

[54] METHOD FOR FORMING A TRENCH POWER METAL-OXIDE SEMICONDUCTOR TRANSISTOR

[75] Inventors: Chun-Liang Fan, Yung Kong; Tien-Min Yuan, Taipei; Shih-Chi Lai, Hsinchu; Yao-Chi Chang, Kaohsiung, all of Taiwan

[73] Assignee: Mosel Vitelic Inc., Taiwan

[21] Appl. No.: 09/351,183

[22] Filed: Jul. 12, 1999

[30] Foreign Application Priority Data

Jun. 9, 1999 [TW] Taiwan .................................. 88109652

[51] Int. Cl.⁷ .................................................. H02L 21/336
[52] U.S. Cl. ........................... 438/270; 438/426; 438/444
[58] Field of Search .................... 438/425, 426, 438/439, 444, 445, 268, 270

[56] References Cited

U.S. PATENT DOCUMENTS

| | | | |
|---|---|---|---|
| 5,256,895 | 10/1993 | Bryant et al. | 257/501 |
| 5,824,594 | 10/1998 | Kim et al. | 438/446 |
| 5,856,230 | 1/1999 | Jang | 438/439 |
| 5,899,726 | 5/1999 | Wang et al. | 438/439 |
| 5,913,133 | 6/1999 | Lee | 438/444 |

*Primary Examiner*—Long Pham
*Attorney, Agent, or Firm*—Harold L. Novick; Nath & Associates

[57] ABSTRACT

A method of forming a trench power metal-oxide semiconductor (MOS) transistor over a semiconductor substrate is proposed in the present invention. First, a pad oxide layer is formed on said substrate, a masking layer is then formed on the pad oxide layer. Next, the masking layer and the pad oxide layer are defined the trench pattern, and the substrate is etched to form the trench structure. A gate oxide layer is formed on the outer surface of the trench structure. Then, a conducting layer is fill into said trench structure for serving as a gate structure. The doped areas are formed in the substrate to serve as source structures. Next, the sidewall spacers are formed on sidewalls of the masking layer and the pad oxide layer. A field oxide layer is then formed on the conducting layer.

20 Claims, 4 Drawing Sheets

METHOD FOR FORMING A TRENCH POWER METAL-OXIDE SEMICONDUCTOR TRANSISTOR

FIELD OF THE INVENTION

The present invention relates to a process for manufacturing a semiconductor device, and more specifically, to a process for manufacturing a trench power metal-oxide semiconductor (MOS) transistor.

BACKGROUND OF THE INVENTION

With the advance of the integrated circuits technology into the ultra large scale integrated circuits (ULSI), the sizes of various devices have gotten smaller and smaller and the design rules of the various devices tend to build the three dimensional structures rather than the plane structures of conventional technique on the semiconductor substrate, in order to manufacture the devices and the integrated circuits with required high integration. Thus, except the shrinkage of the areas which the devices occupied is obtained, the operation performance of the devices are also controlled precisely. Wherein for the trench power metal-oxide semiconductor transistor devices, the space required to manufacture the whole transistor structure is decreased substantially due to the gate structure of the transistor is formed in the trench on the substrate and the source/drain structures are formed above/underneath the gate structure respectively. Thus, the trench power MOS transistor is widely applied and developed in semiconductor manufacture.

Please refer to FIG. 1, wherein the trench power MOS transistor formed by the prior process is illustrated. First, a semiconductor substrate 2 is provided, then the pad oxide layer 4 and nitride layer 6 are deposited on the substrate 2 in sequence. The trench pattern are then defined on the oxide layer 4 and the nitride layer 6 by using the well known photolithography. Next, the nitride layer 6 is used to serve as an etching mask for etching the substrate 2 to form the trench structures 8 on the substrate 2.

After the trench structure 8 is formed, as shown in FIG. 2, a thermal oxidization procedure is done for the substrate 2 to form the thin gate oxide film 10 on the outer surfaces of the trench structure 8. Then, a doped polysilicon layer 12 is formed on the substrate 2 and filled into the trench structure 8. Next, the etching back step is performed to etch the doped polysilicon layer 12 above the nitride layer 6 and to make the doped polysilicon layer 12 have the recessed surfaces as shown in FIG. 2. The top surface of the doped polysilicon layer 12 is lower than the pad oxide layer 4 in order to facilitate manufacturing the field oxide separators in latter process. Then, an implant step is performed to form the doped areas 14 for serving as the source structures of the transistor manufactured in latter process underneath the pad oxide layer 4 and adjacent to the gate oxide layer 10 in the substrate 2. Namely, the source areas 14 are formed adjacent to the sidewalls of the trench structure 8. It is noted that the substrate 2 is used to serve as the drain structure of the trench power MOS transistor.

Next, refer to FIG. 3, a thermal oxidization process is performed for the substrate 2 to form the field oxide layer 16 on the top surface of the doped polysilicon layer 12 for being the insulator structure. In general, the field oxide layer 16 has a thickness about 2500 angstroms in order to promote the insulating efficiency. Besides, the thickness of the field oxide layer 16 is controlled precisely by elongating the process time of the thermal oxidization procedure.

However, the encroachment areas A, as illustrated in FIG. 3, occur along the junction between the pad oxide layer 4 and the gate oxide layer 10 during forming the field oxide layer 16. Namely, the field oxide layer 16 extends through the slits between the pad oxide layer 6 and the gate oxide layer 10 and into the substrate 2 to form the encroachment areas A in the doped areas 14. Thus, the profiles of the doped areas 14 for serving as the source structures alter apparently due to the extensions and encroachments of the field oxide layer, and the operation performances of the trench power MOS devices decrease mainly due to the encroachment area. Generally, the encroachment areas A extend about 400 angstroms when the field oxide layer 16 has a thickness about 2500 angstroms.

As described above, with the integration of the semiconductor process increasing, the scales of the various devices manufactured on the substrate become smaller and smaller. It is noted that the scales of the doped areas 14 and the trench structure 8 defined on the substrate 2 are also decreased substantially. Thus, the encroachment areas A make the yield decrease mainly and make the channel length shrink.

SUMMARY OF THE INVENTION

The prime objective of the present invention is to provide a method for manufacturing a trench power metal-oxide semiconductor transistor.

The second objective of the present invention is to provide a method for preventing the field oxide layer from extending and encroaching into the substrate and forming the encroaching areas during forming the field oxide layer.

A method for forming a trench power metal-oxide semiconductor (MOS) transistor over a semiconductor substrate is provided in the present invention. A pad oxide layer is first formed on the substrate, and a first nitride layer is formed on the pad oxide layer. The first nitride layer and the pad oxide layer are etched to define a trench pattern. Then, the substrate is etched to form a trench structure on the substrate by using the first nitride layer as an etching mask. A gate oxide layer is next formed on an outer surface of the trench structure. A doped polysilicon layer is used to fill into the trench structure, wherein a top surface of the doped polysilicon layer is lower than a top surface of the substrate. The doped areas are formed in the substrate, wherein the doped areas are underneath the pad oxide layer and adjacent to the trench structure. A second nitride layer is deposited on the surfaces of the first nitride layer, the pad oxide layer, the gate oxide layer and the doped polysilicon layer. The second nitride layer is then etched to form sidewall spacers on sidewalls of the first nitride layer and the pad oxide layer, and to expose a top surface of the doped polysilicon layer. A field oxide layer is formed on the doped polysilicon layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed hereinafter to form the nitride sidewall spacers on the sidewalls of the first nitride layer and the pad oxide layer to cover the gate oxide layer completely for insulating the pad oxide layer effectively. Thus, it is effective to prevent the field oxide layer manufactured by performing a thermal oxidization procedure from extending and encroaching into the doped areas of the substrate to form the encroaching areas during forming the field oxide layer. Besides, it is also effective to prevent the profiles of the doped areas from deformation due to the encroachment of the field oxide layer. The detailed description is as follows.

Figure 1:
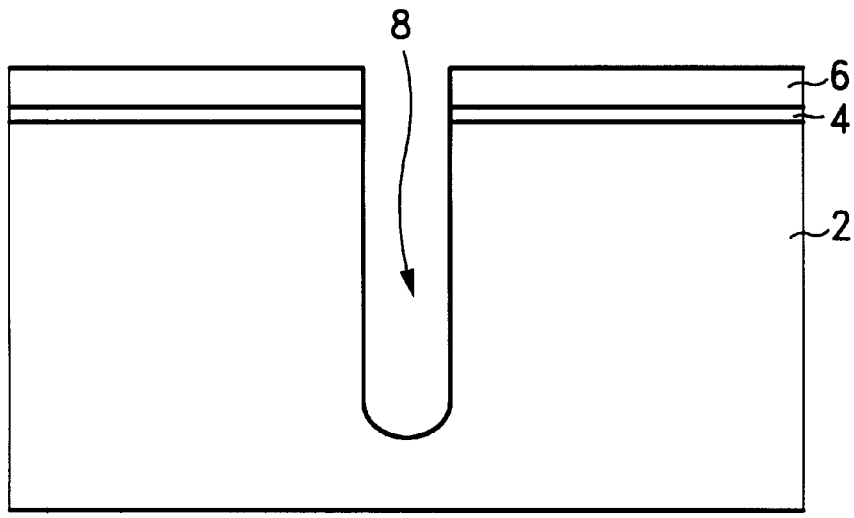
FIG. 1 is a cross sectional view of a semiconductor wafer illustrating the steps of defining the gate structure on the substrate in accordance with the prior art.
Figure 2:
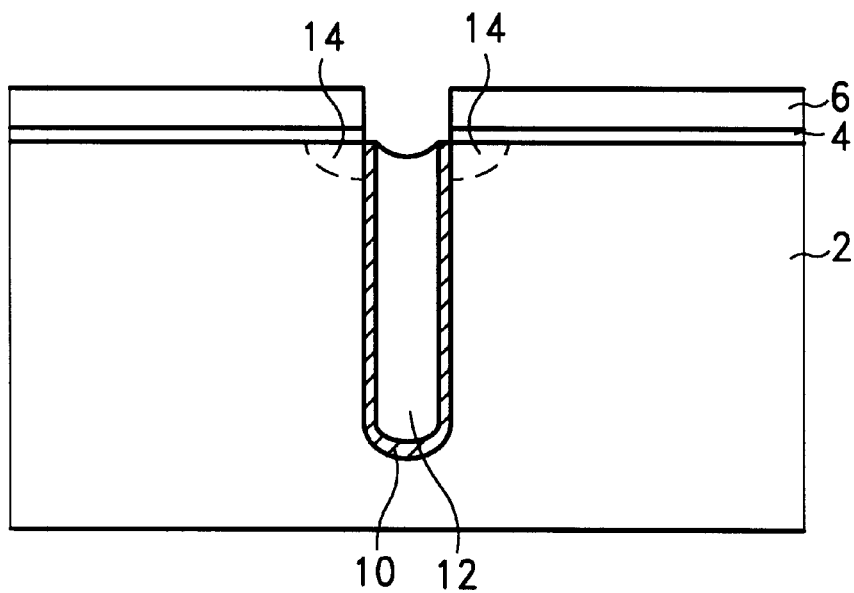
FIG. 2 is a cross sectional view of a semiconductor wafer illustrating the steps of forming a gate oxide layer and doped polysilicon layer in the trench structure in accordance with the prior art.
Figure 3:
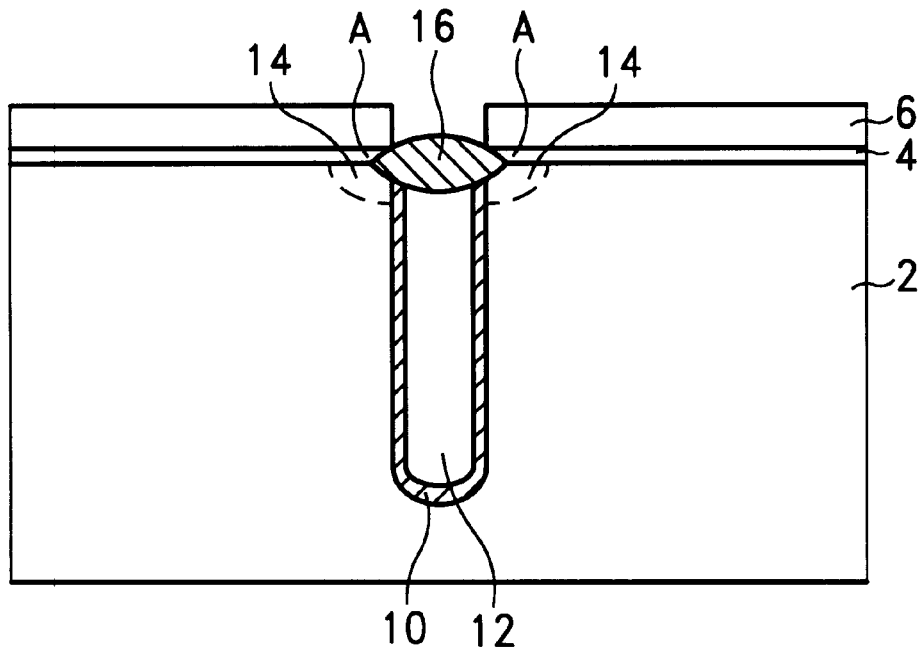
FIG. 3 is a cross sectional view of a semiconductor wafer illustrating the steps of forming field oxide insulator on the surface of the doped polysilicon layer in accordance with the prior art.
Figure 4:
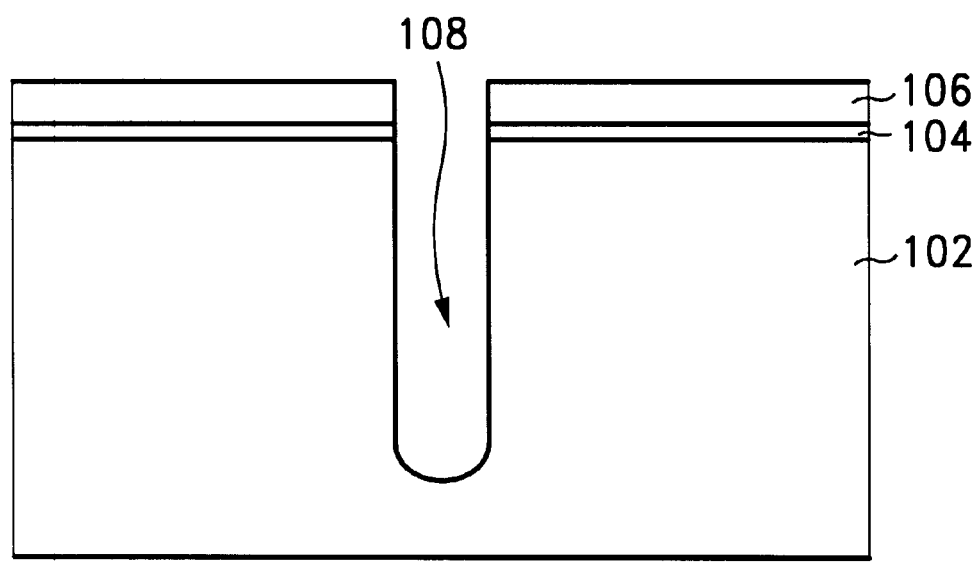
FIG. 4 is a cross sectional view of a semiconductor wafer illustrating the steps of forming a gate oxide layer and doped polysilicon layer in the trench structure in accordance with the present invention.

Refer to FIG. 4, in the preferred embodiment, a silicon substrate 102 is provided with <100> crystallographic orientation. In general, various semiconducting materials, such as gallium arsenide, germanium or silicon on insulator (SOI) can be chosen to serve as the substrate 102. Besides, any other suitable orientation such as <110> or <111> is useful due to the surface property is not critical in the present invention. It is noted that the provided substrate 102 is also used to serve as the drain structure for the trench power MOS transistor manufactured in latter process.

Then, a pad oxide layer 104 is formed on the substrate 102, and the first nitride layer 106 is formed on the top surface of the pad oxide layer 104 to serve as the etching mask in latter process. In general, the pad oxide layer 104 is formed by using an oxygen-steam ambient, at a temperature between about 700 to 1100° C. Alternatively, the pad oxide layer 104 may be formed using other known oxide chemical compositions and procedures. As is known in the art, the pad oxide layer 104 can be formed by using chemical vapor deposition (CVD) process. In the preferred embodiment, the thickness of the pad oxide layer 104 is approximately 50–250 angstroms. Besides, the first nitride layer 106 can be formed using Low Pressure Chemical Vapor Deposition (LPCVD), Plasma Enhance Chemical Vapor Deposition (PECVD), and so on. Further, the temperature forming the first nitride layer 106 is at a range of 400–800° C. In the preferred embodiment, the reaction gases of the step to form nitride layer are $SiH_4$, $NH_3$, $N_2$, $N_2O$ or $SiH_2Cl_2$, $NH_3$, $N_2$, $N_2O$.

Then, the first nitride layer 106 and the pad oxide layer 104 are etched to form the opening on the first nitride layer 106 and the pad oxide layer 104 in order to expose the top surface of a portion of the substrate 102 for defining trench structure in latter procedure. In a preferred embodiment, the etchant used to etch the first nitride layer 106 comprises $CF_4/H_2$, $CHF_3$ and $CH_3CHF_2$. The etchant used to etch the pad oxide layer 104 comprises $CCl_2F_2$, $CHF_3/CF_4$, $CHF_3/O_2$, $CH_3CHF_2$ and $CF_4/O_2$.

Subsequently, an etching step is performed to etch the substrate 102 by using the first nitride layer 106 as an etching mask for forming a trench structure 108 on the substrate 102. In a preferred embodiment, a reactive ion etching (RIE) step is used to form the trench structure 6, and the etchant used in this step can chosen from the group of $SiCl_4/Cl_2$, $BCl_3/Cl_2$, $HBr/Cl_2/O_2$, $HBr/O_2$, $Br_2/SF_6$ and $SF_6$.

Figure 5:
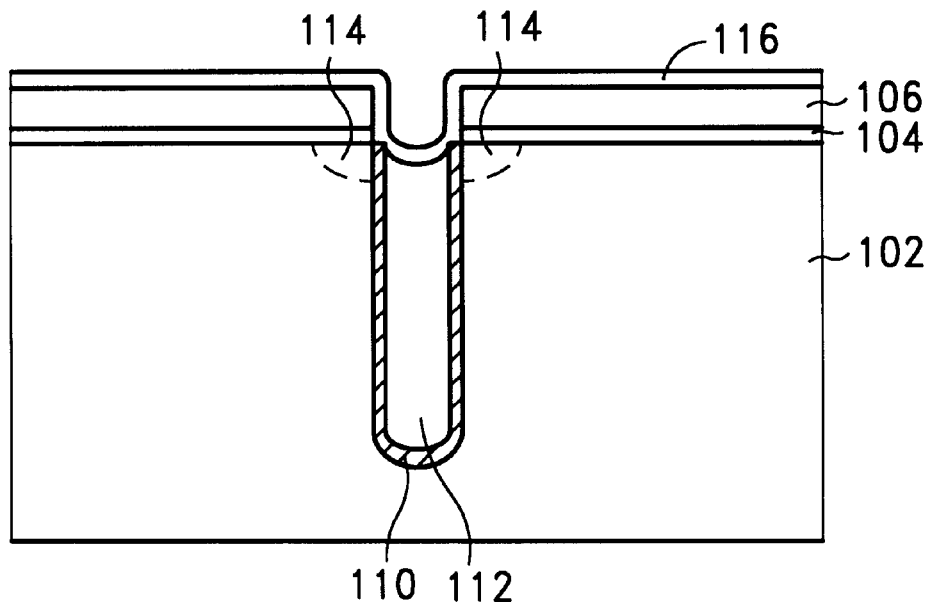
FIG. 5 is a cross sectional view of a semiconductor wafer illustrating the steps of forming the gate oxide layer and doped polysilicon layer in the trench structure in accordance with the present invention.

Refer to FIG. 5, a thin gate oxide layer 110 is formed on the outer surface of the trench structure 108. In the preferred embodiment, the gate oxide layer 110 with a thickness about 15 to 250 angstroms is formed by performing a thermal oxidization procedure in an oxygen-steam ambient, at a temperature between about 700 to 1100° C. Then, a doped polysilicon layer 112 is formed to fill into the trench structure 108 for being the trench gate structure of the power transistor manufactured in latter process.

Generally, a doped polysilicon layer is firstly formed on the substrate 102 and filled into the trench structure 108. An etching back step is then performed to remove the doped polysilicon layer above the first nitride layer 106 and to make the top surface of the residual doped polysilicon layer 112 is lower than the pad oxide layer 104. Namely, the doped polysilicon layer 112 with a recessed top surface is formed as illustrated in FIG. 5. It is noted that other conducting materials can be chosen to substitute for the doped polysilicon layer 112, wherein the conducting materials comprise of in-situ doped polysilicon, copper, aluminum, tungsten, titanium, platinum and alloy.

Next, an implant procedure is performed to dope the substrate 102 for forming the doped areas 114 in the substrate 102 to serve as the source areas of the transistor, wherein the doped areas 114 are underneath the pad oxide layer 104 and adjacent to gate oxide layer 110. Namely, the doped areas 114 are formed on the upper sidewalls of the trench structure 108.

Then, the second nitride layer 116 is formed along the surfaces of the first nitride layer 106, the pad oxide layer 104, the gate oxide layer 110 and the doped polysilicon layer 112, wherein the second nitride layer 116 can be formed using Low Pressure Chemical Vapor Deposition (LPCVD), Plasma Enhance Chemical Vapor Deposition (PECVD), and so on. Further, the temperature forming the second nitride layer 116 is at a range of 400–800° C., and the second nitride layer 116 has a thickness about 600 to 1400 angstroms. In the preferred embodiment, the reaction gases of the step to form the second nitride layer 116 are $SiH_4$, $NH_3$, $N_2$, $N_2O$ or $SiH_2Cl_2$, $NH_3$, $N_2$, $N_2O$.

Figure 6:
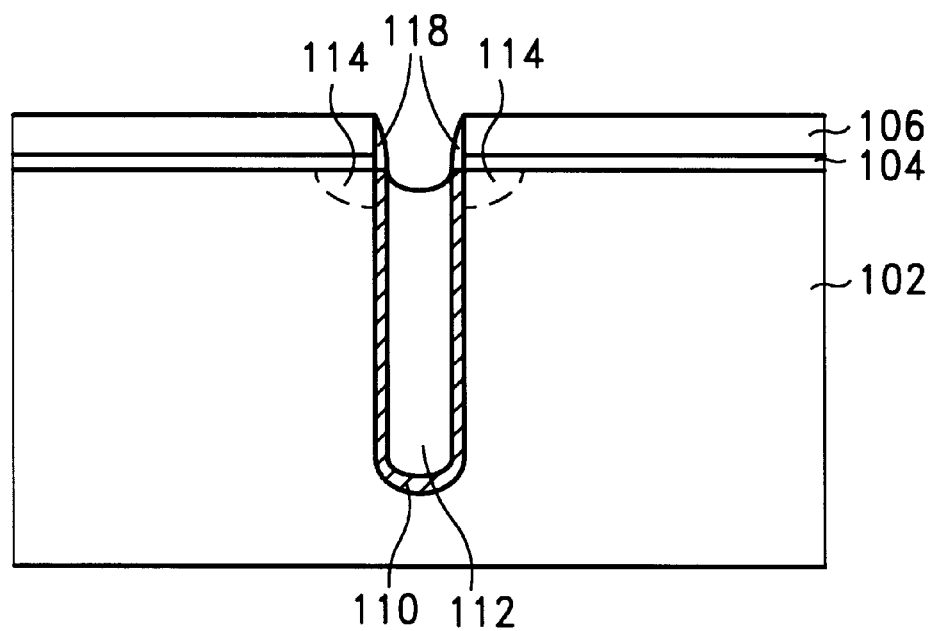
FIG. 6 is a cross sectional view of a semiconductor after illustrating the steps of forming sidewall spacers on the sidewalls of the nitride layer in accordance with the present invention.

Refer to FIG. 6, the second nitride layer 116 is etched to form the sidewall spacers 118 on the sidewalls of the first nitride layer 106 and the pad oxide layer 104 for covering the outer surface of the gate oxide layer 110, wherein the etching back step is also used to remove the second nitride layer 116 on the doped polysilicon layer 112 for exposing the top surface of the doped polysilicon layer 112. In a preferred embodiment, a reactive ion etching (RIE) step is used to etch the second nitride layer 116 to form the sidewall spacers 118, and the etchant used to etch the second nitride layer comprises $CF_4/H_2$, $CHF_3$ and $CH_3CHF_2$.

Figure 7:
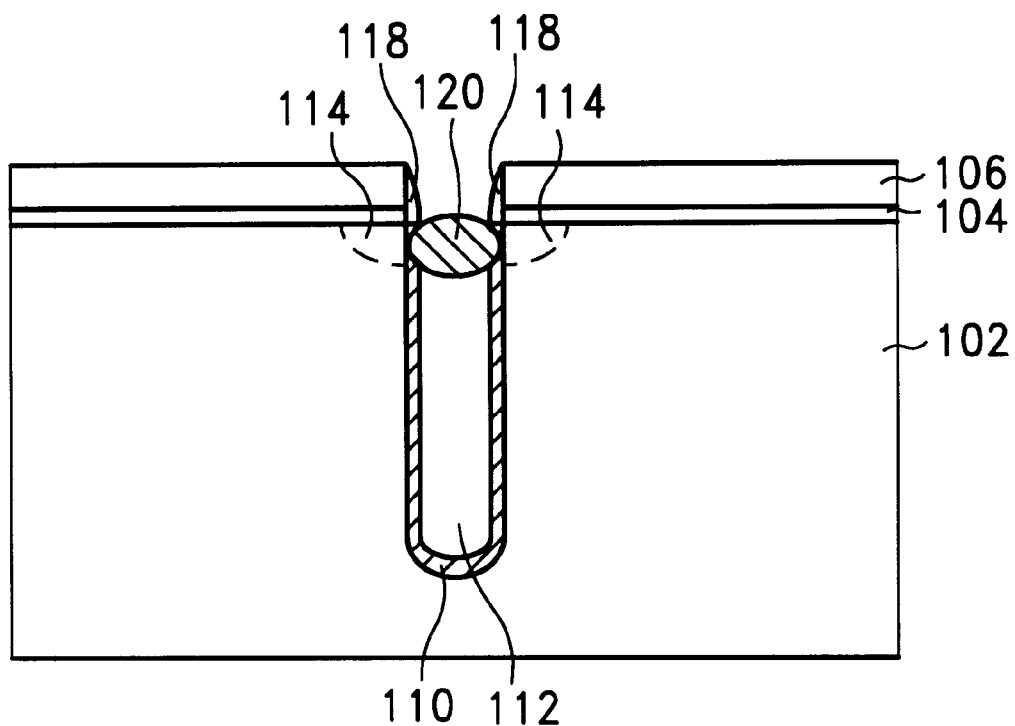
FIG. 7 is a cross sectional view of a semiconductor wafer illustrating the steps of forming the field oxide layer on the top surface of the doped polysilicon layer in accordance with the present invention.

Then, as shown in FIG. 7, after the sidewall spacers 118 are formed, a field oxide layer 120 is formed on the doped polysilicon layer 112. In the preferred embodiment, the field oxide layer 120 with a thickness about 2000 to 5000 angstroms is formed by performing a thermal oxidization procedure in an oxygen-steam ambient, at a temperature between about 700 to 1100° C.

It is effective to prevent the field oxide layer from encroaching and extending along the pad oxide layer and forming the encroachment areas in the doped areas which is used to be the source structures by using the method provided in the present invention. Thus, the profiles of the doped areas will not be damaged and affected due to the encroachment areas of the field oxide layer. It is noted that the pad oxide layer is insulated effectively and completely by forming the nitride spacers on the sidewalls of the first nitride layer and the pad oxide layer to cover the outer surface of the pad oxide layer. Therefore, the field oxide layer will not encroach and extend along the pad oxide layer into the doped areas for forming oxide encroachment areas during forming the field oxide layer.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a trench power metal-oxide semiconductor (MOS) transistor over a semiconductor substrate, said method comprises the following steps of:

forming a pad oxide layer on said substrate;

forming a masking layer on said pad oxide layer;

etching said masking layer and said pad oxide layer to define a trench pattern on said masking layer and said pad oxide layer;

etching said substrate to form a trench structure on said substrate by using said masking layer as an etching mask;

forming a gate oxide layer on an outer surface of said trench structure;

forming a conducting layer to fill into said trench structure for serving as a gate structure, wherein a top surface of said conducting layer is lower than a top surface of said substrate, forming doped areas in said substrate to serve as source structures, wherein said doped areas are underneath said pad oxide layer and adjacent to said gate oxide layer forming sidewall spacers on sidewalls of said masking layer and said pad oxide layer for covering out surfaces of said gate oxide layer; and forming a field oxide layer on said conducting layer, wherein said sidewall spacers are used to insulate said pad oxide layer for avoiding encroachment areas occurring and extending into said doped areas during forming said field oxide layer.

2. The method of claim 1, wherein said masking layer comprises a nitride layer.

3. The method of claim 1, wherein said substrate is used to serve as a drain structure of said trench power MOS transistor.

4. The method of claim 1, wherein said conducting layer is selected from the group of doped polysilicon, in-situ doped polysilicon, aluminum, copper, tungsten, titanium, platinum and alloy.

5. The method of claim 1, wherein said pad oxide layer has a thickness about 50 to 250 angstroms.

6. The method of claim 1, wherein said gate oxide layer has a thickness about 15 to 250 angstroms.

7. The method of claim 1, wherein said gate oxide layer is formed by using a thermal oxidization procedure.

8. The method of claim 1, further comprises a step to form a nitride layer to cover said masking layer, said pad oxide layer, said gate oxide layer, and said conducting layer before forming said sidewall spacers.

9. The method of claim 8, further comprises a step to etch back said nitride layer after forming said nitride layer to form said sidewall spacers on said sidewall on said sidewalls of said masking layer and said pad oxide layer, and to expose a top surface of said conducting layer.

10. The method of claim 8, wherein said nitride layer has a thickness about 600 to 1400 angstroms.

11. The method of claim 1, wherein said field oxide layer is formed by using a thermal oxidization procedure.

12. The method of claim 1, wherein said field oxide layer has a thickness about 2000 to 5000 angstroms.

13. A method of forming a trench power metal-oxide semiconductor (MOS) transistor over a semiconductor substrate, said method comprises the following steps of:

forming a pad oxide layer on said substrate;

forming a first nitride layer on said pad oxide layer;

etching said first nitride layer and said pad oxide layer to define a trench pattern on said first nitride layer and said pad oxide layer;

etching said substrate to form a trench structure on said substrate by using said first nitride layer as an etching mask;

forming a gate oxide layer on an outer surface of said trench structure;

forming a doped polysilicon layer to fill into said trench structure, wherein a top surface of said doped polysilicon layer is lower than a top surface of said substrate;

forming doped areas in said substrate, wherein said doped areas are underneath said pad oxide layer and adjacent to said gate oxide layer;

forming a second nitride layer on surfaces of said first nitride layer, said pad oxide layer, said gate oxide layer and said doped polysilicon layer;

etching said second nitride layer to expose a top surface of said doped polysilicon layer, wherein sidewall spacers are formed on sidewalls of said first nitride layer and said pad oxide layer for covering out surfaces of said gate oxide layer; and forming a field oxide layer on said doped polysilicon layer, wherein said sidewall spacers are used to insulate said pad oxide layer for avoiding encroachment areas extending into said doped areas during forming said field oxide layer.

14. The method of claim 13, wherein said pad oxide layer has a thickness about 50 to 250 angstroms.

15. The method of claim 13, wherein said gate oxide layer has a thickness about 15 to 250 angstroms.

16. The method of claim 13, wherein said gate oxide layer is formed by using a thermal oxidization procedure.

17. The method of claim 13, wherein said nitride layer has a thickness about 600 to 1400 angstroms.

18. The method of claim 13, wherein said field oxide layer is formed by using a thermal oxidization procedure.

19. The method of claim 13, wherein said field oxide layer has a thickness about 2000 to 5000 angstroms.

20. The method of claim 13, wherein said substrate is used to serve as a drain structure of said trench power MOS transistor.

* * * * *